US009172367B2

(12) United States Patent
Fukuta et al.

(10) Patent No.: US 9,172,367 B2
(45) Date of Patent: Oct. 27, 2015

(54) DRIVE UNIT FOR SWITCHING ELEMENT (71) Applicant: DENSO CORPORATION, Kariya, Aichi-pref. (JP)

(72) Inventors: Junichi Fukuta, Kuwana (JP); Tsuneo Maebara, Nagoya (JP); Ryotaro Miura, Kariya (JP); Takeyasu Komatsu, Chiryu (JP)

(73) Assignee: DENSO CORPORATION, Kariya (JP)

( * ) Notice: Subject to any disclaimer, the term of this patent is extended or adjusted under 35 U.S.C. 154(b) by 291 days.

(21) Appl. No.: 13/892,829

(22) Filed: May 13, 2013

(65) Prior Publication Data

US 2013/0307593 A1    Nov. 21, 2013

(30) Foreign Application Priority Data

May 16, 2012  (JP) .................................. 2012-112122

(51) Int. Cl.
*H02P 6/08* (2006.01)
*H02M 1/08* (2006.01)
*H03K 17/30* (2006.01)
*H03K 17/06* (2006.01)

(52) U.S. Cl.
CPC ................ *H03K 17/30* (2013.01); *H03K 17/06* (2013.01); *H03K 2017/066* (2013.01)

(58) Field of Classification Search
USPC .................................................. 318/430–434
See application file for complete search history.

(56) References Cited

U.S. PATENT DOCUMENTS

| 3,569,810 | A | * | 3/1971 | Thiele | 318/341 |
| 4,508,976 | A | * | 4/1985 | Hickman et al. | 327/109 |
| 7,933,105 | B2 | * | 4/2011 | Yamawaki et al. | 361/93.1 |
| 2012/0025875 | A1 | | 2/2012 | Fukuta et al. | |

FOREIGN PATENT DOCUMENTS

| JP | 2001-109525 | 4/2001 |
| JP | 2012-034450 | 2/2012 |

OTHER PUBLICATIONS

Office Action (2 pages) dated Apr. 15, 2014, issued in corresponding Japanese Application No. 2012-112122 and English translation (2 pages).

* cited by examiner

*Primary Examiner* — Bentsu Ro
(74) *Attorney, Agent, or Firm* — Nixon & Vanderhye P.C.

(57) ABSTRACT

In a drive unit for a switching element, a drive circuit changes the switching element between an on-state and an off-state, by controlling a potential difference between a reference terminal, which is one of a pair of ends of a current path of the switching element, and an opening-closing control terminal of the switching element. A determination section determines, if an on-operation command or an off-operation command is inputted as an operation signal for the switching element, whether or not the potential difference has reached a specific value toward which the potential difference shifts, in response to one of the operation commands, with respect to a threshold value by which the switching element is turned on. A forcible processing section removes charge for turning on the switching element from the opening-closing control terminal, if the determination section determines that the potential difference has not reached the specific value.

4 Claims, 6 Drawing Sheets

DRIVE UNIT FOR SWITCHING ELEMENT

CROSS-REFERENCE TO RELATED APPLICATION

This application is based on and claims the benefit of priority from earlier Japanese Patent Application No. 2012-112122 filed May 16, 2012, the description of which is incorporated herein by reference.

BACKGROUND

1. Technical Field

The present invention relates to a drive unit for a switching element which is a target to be driven (hereinafter, referred to as "target switching element"). The target switching element is a voltage control type switching element. The drive unit changes the target switching element between an on-state and an off-state, by controlling a potential difference between a reference terminal, which is one of a pair of ends of a current path of the target switching element, and an opening and closing control terminal of the switching element.

2. Related Art

For example, JP-A-2012-34450 discloses a configuration which includes a function of determining whether or not a voltage (gate voltage) between the gate and the emitter of an IGBT (Insulated gate bipolar transistor), which is the target switching element, is an intermediate voltage, which is higher than a threshold voltage by which the IGBT is turned on but is lower than a voltage applied to the gate when the IGBT is turned. According to this configuration, the IGBT can be forcibly turned off, if the gate voltage remains an intermediate voltage even though the IGBT is being turned on or off.

However, the above technique has the following disadvantages. First, when the IGBT is being turned off, in addition to the problem that the gate voltage may remain at the intermediate voltage, it is also a problem that the gate voltage may remain at a voltage higher than the intermediate voltage. Second, when the IGBT is being turned on, in addition to the problem that the gate voltage remains the intermediate voltage, it is a problem that the IGBT is not completely turned on.

SUMMARY

An embodiment provides a drive unit for a switching element to be targeted. The target switching element is a voltage control type switching element. The drive unit changes the target switching element between an on-state and an off-state, by controlling a potential difference between a reference terminal, which is one of a pair of ends of a current path of the target switching element, and an opening and closing control terminal of the switching element.

As an aspect of the embodiment, a drive unit for a switching element is provided. The drive unit includes: a drive circuit which changes a target switching element between an on-state and an off-state, by controlling a potential difference between a reference terminal, which is one of a pair of ends of a current path of the target switching element, and an opening and closing control terminal of the target switching element; a determination section which determines, if an on-operation command or an off-operation command is inputted as an operation signal for the target switching element, whether or not the potential difference has reached a specific value toward which the potential difference shifts, in response to one of the operation commands, with respect to a threshold value by which the target switching element is turned on; and a forcible processing section which removes charge for turning on the target switching element from the opening and closing control terminal, if the determination section determines that the potential difference has not reached the specific value.

DETAILED DESCRIPTION OF THE PREFERRED EMBODIMENTS

With reference to the accompanying drawings, hereinafter are described embodiments of the present invention.

First Embodiment

Hereinafter, the first embodiment will be described in which a drive unit for a switching element is applied to a power converter circuit connected to an in-vehicle traction unit.

Figure 1:
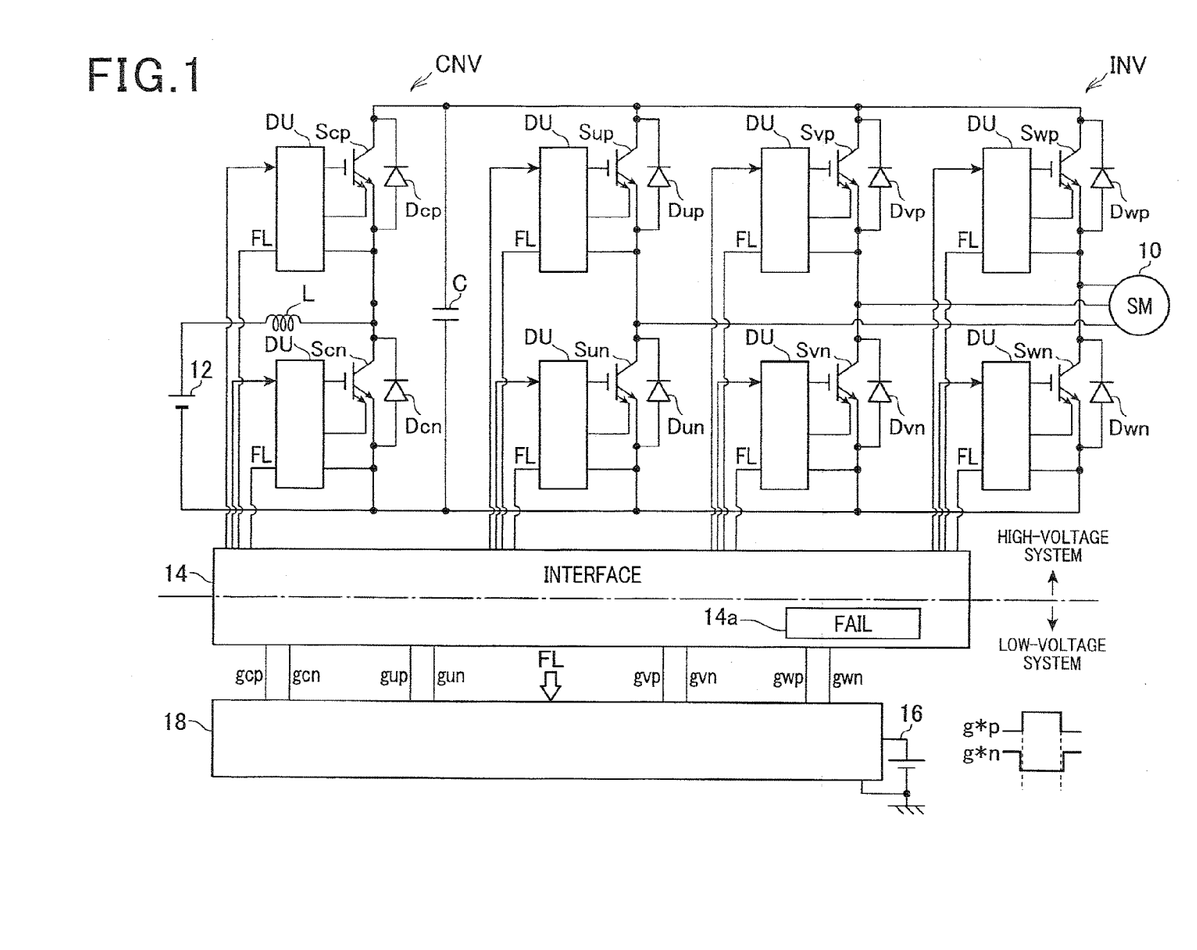
FIG. 1 is a diagram showing a configuration of a system according to a first embodiment.

A motor generator 10 is an in-vehicle traction unit which is mechanically connected to drive wheels, which are not shown. The motor generator 10 is connected to a high-voltage battery 12 via an inverter INV and a boost converter CNV. The boost converter CNV includes a capacitor C, a pair of switching elements Scp and Scn, and a reactor L. The switching elements Scp, Scn are connected to the capacitor C in parallel. The reactor L connects between the positive electrode of the high-voltage battery 12 and the connecting point between the switching elements Scp, Scn. Specifically, the boost converter CV has a function of increasing the voltage of the high-voltage battery 12 (e.g., 100 V or more), with a predetermined voltage (e.g., 666 V) as an upper limit, by turning on/off the switching elements Scp, Scn. The inverter INV includes a series connection of switching elements Sup and Sun, a series connection of switching elements Svp and Svn, and a series connection of switching elements Swp and Swn. The connecting points of these series connections are connected to respective phases, that is, U phase, V phase, and W phase of the motor generator 10. As the switching elements S¥# (¥=u, v, w, c; #=p, c), insulated gate bipolar transistors (IGBTs) are used. Diodes D*# are connected to the respective switching elements S¥# in anti-parallel.

A controller 18 uses a low-voltage battery 16 as a power supply. The controller 18 controls the motor generator 10 to operate the inverter INV and the boost converter CNV so that controlled variables are desirably controlled. Specifically, the controller 18 outputs operation signals gcp, gcn to drive units DU to operate the switching elements Scp, Scn of the boost converter CNV. In addition, the controller 18 outputs operation signals gup, gun, gyp, gvn, gwp, gwn to the drive units DU to operate the switching elements Sup, Sun, Svp, Svn, Swp, Swn of the inverter INV. Note that high-potential side operation signals g¥p and low-potential side operation signals g¥n, which correspond to the high-potential side operation signals g¥p, are complementary to each other. In other words, the high-potential side switching elements S¥p and the corresponding low-potential side switching elements S¥n are alternately turned on.

Note that a high-voltage system including the high-voltage battery 12 and a low-voltage system including the low-voltage battery 16 are insulated from each other. Signals are communicated between the high-voltage system and the low-voltage system via an interface 14 including an insulation communication means such as a photocoupler.

Figure 2:
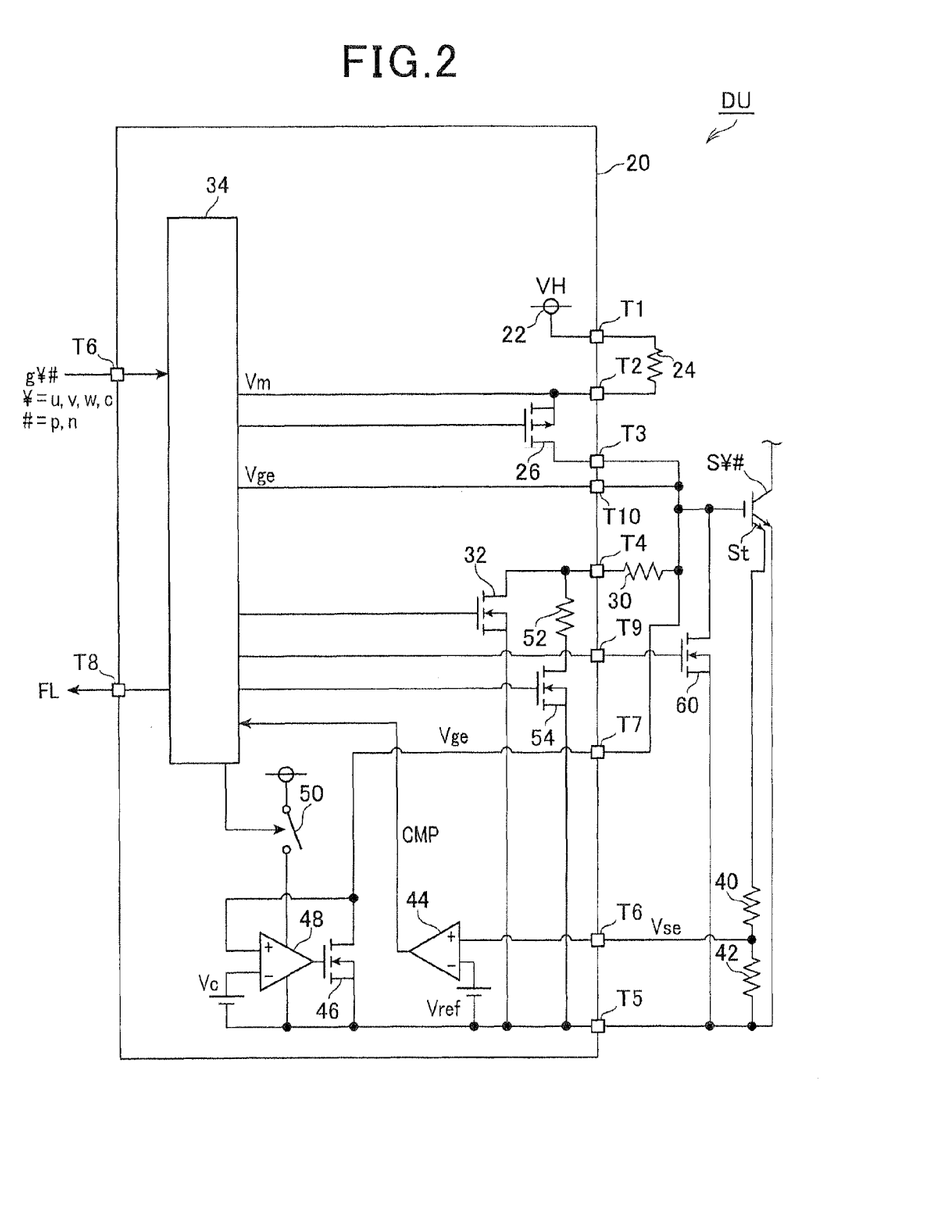
FIG. 2 is a diagram showing a configuration of a circuit of a drive unit according to the first embodiment.

FIG. 2 shows a configuration of the drive unit DU.

As shown in FIG. 2, the drive unit DU includes a drive IC 20, which is a one-chip semiconductor integrated circuit. The drive IC 20 includes a DC voltage source 22 having a terminal voltage VH. A terminal of the DC voltage source 22 is connected to the opening and closing control terminal (gate) of a switching element S¥# via a terminal T1, a charging resistor 24, a terminal T2, a P-channel metal-oxide semiconductor field-effect transistor (MOSFET) (charging switching element 26), and a terminal T3.

The gate of the switching element S¥# is connected to a terminal T5 via a discharging resistor 30, a terminal T4, and an N-channel MOSFET (discharging switching element 32). The terminal T5 is connected to a reference terminal (emitter), which is one of a pair of ends of a current path of the switching element S¥#.

The charging switching element 26 and the discharging switching element 32 are operated by a drive controller 34 of the drive IC 20. That is, the drive controller 34 drives the switching element S¥# by alternately turning on and off the charging switching element 26 and the discharging switching element 32 on the basis of an operation signal g¥# received via the terminal T6. Specifically, if the operation signal g¥# serves as an on-operation command, the drive controller 34 turns off the discharging switching element 32 and turns on the charging switching element 26. Meanwhile, if the operation signal g¥# serves as an off-operation command, the drive controller 34 turns off the charging switching element 26 and turns on the discharging switching element 32.

During the period of time the charging switching element 26 is turned on, the voltage applied to the opening and closing control terminal (gate) is controlled to control the amount of voltage drop of the charging resistor 24 (voltage Vm at the terminal T2) so as to agree with a specified value. Thereby, the amount of the current flowing through the charging resistor 24 can be made constant. Furthermore, a gate charging process for the switching element S¥# can be performed under constant current control.

During the period of time the discharging switching element 32 is turned on, charge for turning on the switching element S¥# is removed from the gate of the switching element S¥# via a normal time discharging path including the discharging resistor 30 and the discharging switching element 32. Specifically, gate discharge current flows to the discharging resistor 30 so that the amount of voltage drop of the discharging resistor 30 becomes equal to the gate voltage, whereby constant voltage control is performed. Note that the drive controller 34 monitors the gate voltage Vge via a terminal T10. If the gate voltage becomes equal to or less than an off-keeping threshold voltage, the drive controller 34 controls the gate voltage of an N-channel MOSFET (off-keeping switching element 60) via the terminal T9 to turn on the off-keeping switching element 60. The off-keeping switching element 60 connects the gate and the emitter of the switching element S¥# with impedance lower than that of the normal time discharging path (that is, a short circuit is established). This prevents the switching element S¥# from malfunctioning due to noise. Note that, in the present embodiment, the off-keeping threshold voltage is set to a value equal to or lower than the gate voltage at which the switching element S¥# becomes an on-state.

The gate of the switching element S¥# is connected to a terminal T7. The terminal T7 is connected to the terminal T5 via an N-channel MOSFET (clamping switching element 46). An output voltage of an operational amplifier 48 is applied to the gate of the clamping switching element 46. A clamp voltage Vc is applied to an inverting input terminal of the operational amplifier 48. A gate voltage Vge of the switching element S¥# is applied to the non-inverting input terminal of the operational amplifier 48 via the terminal T7. Power supply for the operational amplifier 48 is started or stopped by a power supply switching element 50.

The terminal T4 is connected to the terminal T5 via a soft breaking resistor 52 and an N-channel MOSFET (soft breaking switching element 54).

The switching element S¥# includes a sense terminal St which outputs a minute current having correlation to a current (collector current) flowing through a current path (between the collector and the emitter) of the switching element S¥#. The sense terminal St is electrically connected to the emitter via a series connection of resistors 40 and 42. Hence, since voltage drop is caused in the resistor 42 due to the current outputted from the sense terminal St, the amount of voltage drop of the resistor 42 (sense voltage Vse) can be assumed to be an electric quantity of state having correlation to a current flowing through the current path of the switching element S¥#.

The sense voltage Vse is applied to the non-inverting input terminal of a comparator 44 via the terminal T6. A reference voltage Vref corresponding to an overcurrent threshold value Ith is applied to the inverting input terminal of the comparator 44. Hence, if the collector current becomes equal to or more than the overcurrent threshold value Ith, an output signal CMP of the comparator 44 is inverted from logic "L" to logic "H". The output signal CMP is received by the drive controller 34. The situation in which the collector current becomes equal to or more than the overcurrent threshold value Ith is assumed to be caused when, for example, both the switching element S¥p of an upper arm and the switching element S¥n of a lower arm are turned on, and a pair of terminals of the capacitor C serving as a DC voltage source is short-circuited.

If the collector current has become equal to or more than the overcurrent threshold value Ith, the drive controller 34 operates the soft breaking switching element 54 to perform an overcurrent break process, in which the gate of the switching element S¥# is discharged, and the switching element S¥# is forcibly turned off.

Figure 3:
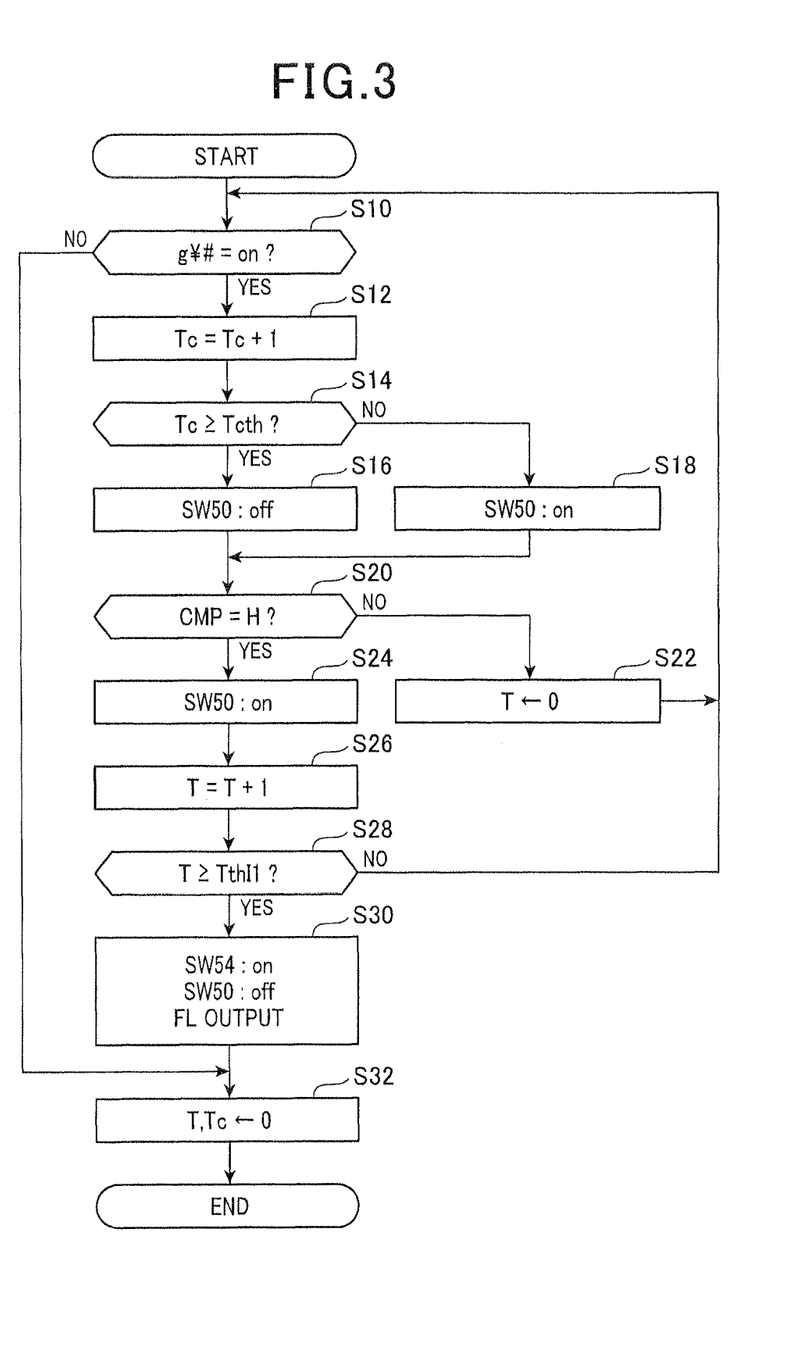
FIG. 3 is a flow diagram showing a procedure of an overcurrent break process according to the first embodiment.

FIG. 3 shows a procedure of an overcurrent break process according to the present embodiment. This process is performed by the drive controller 34.

In this process, first in step S10, it is determined whether or not the operation signal g¥# is an on-operation command. If it is determined that the operation signal g¥# is an on-operation command, in step S12, a clamping counter Tc, which times a process for limiting gate voltage performed by the clamping switching element 46, is incremented. In step S14, it is determined whether or not the clamping counter Tc is equal to or more than a clamping threshold time Tcth. The clamping threshold time Tcth is set to a time during which the clamping switching element 46 performs the process for limiting gate voltage regardless of whether or not a current equal to or more than the overcurrent threshold value Ith is flowing. This prevents a situation in which a current flowing through the switching element SY# far exceeds the overcurrent threshold value Ith during a delay period between the time when the current flowing through the switching element SY# becomes equal to or more than the overcurrent threshold value Ith and the time when the drive controller 34 turns on the power supply switching element 50.

In step S14, if a positive determination is made, in step S16, the power supply switching element 50 is turned on. In contrast, if a negative determination is done, in step S18, the power supply switching element 50 is turned off. If the power supply switching element 50 is turned on, gate voltage of the clamping switching element 46 is controlled by the operational amplifier 48, thereby controlling the gate voltage Vge of the switching element SY# so as to agree with the clamp voltage Vc. Note that the clamp voltage Vc is set to a gate voltage, which corresponds to a gate voltage by which a current equal to or more than the overcurrent threshold value Ith can flow through the switching element SY#, and corresponds to a current value by which it is assumed that reliability of the switching element SY# does not decrease in a short time.

If the processes in steps S16 and S18 are completed, in step S20, it is determined whether or not an output signal CMP of the comparator 44 is in logic "H". This process configures an overcurrent determination means in the present embodiment. In step S20, if a positive determination is done, in step S24, the power supply switching element 50 is turned on. If the clamping threshold time Tcth has not yet passed after the operation signal gY# is changed to on-operation command, the power supply switching element 50 is in an on-state regardless of the process of step S24.

Next, in step S26, a counter T, which clocks time during which an output signal CMP of the comparator 44 is in logic "H", is incremented. In step S28, it is determined whether or not the counter T is equal to or more than an overcurrent threshold time TthI1. This process is for determining whether or not a process, which forcibly turns off the switching element SY#, is performed.

In step S20, if a negative determination is done, in step S22, the counter T is initialized. If the process of step S22 is completed, or a negative determination is done in step S28, the overcurrent break process returns to step S10.

In step S28, if a positive determination is done, in step S30, the soft breaking switching element 54 is turned on, and the power supply switching element 50 is turned off. The process for forcibly turning off the switching element SY# is performed by using the soft breaking switching element 54 to prevent a situation in which surge voltage becomes excessive. That is, under a situation in which surge voltage becomes excessive, if speed at which the switching element SY# is changed from an on-state to an off-state, that is, breaking speed between the collector and the emitter, is increased, surge voltage can become excessive. Hence, under a situation in which it is determined that collector current becomes equal to or more than the overcurrent threshold value Ith, the gate of the switching element SY# is discharged through a path (soft breaking discharging path) having a resistance value larger than that of the discharging path (normal time discharging path) including the discharging resistor 30 and the discharging switching element 32. Note that this process configures an overcurrent breaking processing means.

In step S30, a fail signal FL is outputted to a low-voltage system (controller 18) and a fail processing unit 14a. When receiving the fail signal FL, the fail processing unit 14a shuts down the inverter INV and the boost converter CNV. Note that the fail processing unit 14a may be configured as shown in FIG. 3 of JP-A-2009-60358.

If the process of step S30 is completed, or a negative determination is done in step S10, in step S32, the clamping counter Tc and the counter T are initialized. Then, the overcurrent break process is ended.

According to the above process, it is monitored whether or not the collector current Ic becomes excessively large on the basis of the operation signal gYp or gYn corresponding to the on-operation command. Hence, basically, a fault in which both the switching elements SYp and SYn turn on can be prevented from occurring. Note that it is concerned that the above process is insufficient depending on the factor which causes the fault in which both the switching elements SYp and SYn are turned on.

This factor is, for example, a situation in which, when an operation signal gYp of an upper arm serves as an on-operation command, and an operation signal gYn of a lower arm serves as an off-operation command, the gate voltage of the switching element SYp of the lower arm does not sufficiently decrease, is equal to or more than a threshold voltage Vth at which the switching element SYp of the lower arm is turned on, and remains a value lower than the voltage VH. In this case, since impedance of a current path (between the collector and the emitter) of the switching element SYp of the lower arm is higher, it is concerned that collector currents of the switching elements SYp and SYn do not reach the overcurrent threshold value Ith. If collector currents of the switching elements SYp and SYn do not reach the overcurrent threshold value Ith, conduction loss in the switching element SYn becomes larger, which increases temperature significantly. Hence, it is possible that the switching element SY# could fail under these circumstances. If this failure is a short-circuit failure in which impedance of a current path of the switching element SY# becomes lower regardless of the gate voltage, the gate voltage of the switching element SYp becomes the voltage VH. Thereby, a current extremely larger than the overcurrent threshold value Ith flows to the switching elements SYp, SYn.

Such a situation is serious compared with the situation in which the switching element SYn has already been in short-circuit failure when the switching element SYp is changed to an on-state. This is because, if the switching element SYn has already been in short-circuit failure when the switching element SYp is changed to an on-state, the gate voltage of the switching element SYp is limited before the gate voltage increases up to the voltage VH, which limits the current flowing to the switching element SYp.

To solve the above problem, in the present embodiment, a forcible off-operation process is performed while the operation signal gY# is an off-operation command. In the forcible off-operation process, it is monitored whether or not the switching element SY# is in an off-state. If the switching element SY# is not in an off-state, the switching element SY# is forcibly turned off.

Figure 4:
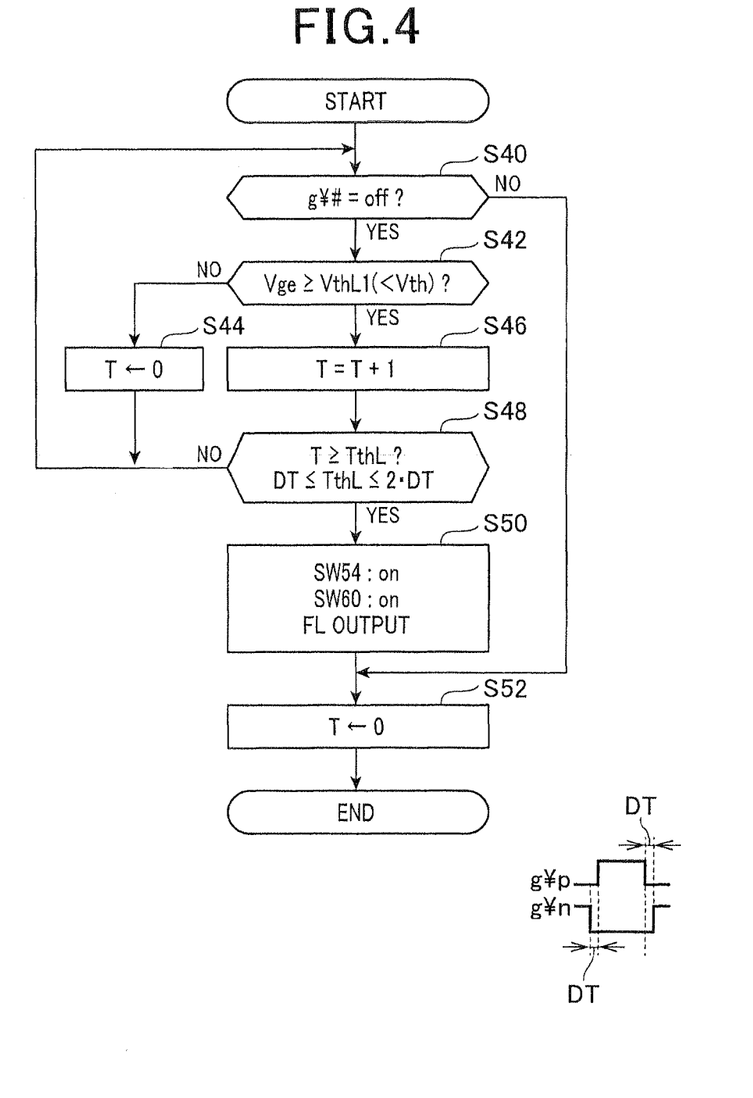
FIG. 4 is a flow diagram showing a procedure of a forcible discharge process when an off-operation is performed according to the first embodiment.

FIG. 4 shows a procedure of the forcible off-operation process. This process is performed by the drive controller 34.

In the forcible off-operation process, first in step S40, it is determined whether or not the operation signal gY# is an on-operation command. If a positive determination is done, in step S42, it is determined whether or not the gate voltage Vge is equal to or more than an off threshold voltage VthL1. The off threshold voltage VthL1 is set to a value lower than the threshold voltage Vth at which the switching element SY# is turned on. Note that if the off threshold voltage VthL1 is set to the off-keeping threshold voltage, the number of means for generating threshold voltages can be decreased.

In step S42, if a positive determination is done, in step S46, the counter T is incremented which clocks time during which the gate voltage Vge is equal to or more than the off threshold voltage VthL1 in a situation where the operation signal gY# serves as an off-operation command. Next, in step S48, it is determined whether or not the counter T is equal to or more than the off threshold time TthL. This process is for determining whether or not a fault has occurred in which the switching element SY# is not turned off regardless of the off-operation command. Note that the off threshold time TthL is set so as to be equal to or more than the time during which the switching element SY# is changed to an off-state according to the off-operation command. Particularly, in the present embodiment, the threshold time TthL is set so as to be longer than a dead time DT, during which both the switching elements SYp and SYn of the upper and lower arms correspond to the off-operation commands, and to be shorter than 2×DT. The threshold time TthL is set so as to be longer than the dead time DT considering that the dead time DT is set so as to be longer than the time required for changing the switching state. Note that, the process of step S48 configures an off-operation determination means.

In step S42, if a negative determination is done, in step S44, the counter T is initialized. If the process of step S44 is completed, or a negative determination is done in step S48, the overcurrent break process returns to step S40.

In contrast, in step S48, if a positive determination is done, in step S50, the soft breaking switching element 54 and the off-keeping switching element 60 are turned on. In the present embodiment, this process configures a forcible off-operation processing means. In step S50, a fail signal FL is outputted to the controller 18. Hence, the user can be informed via the controller 18 that a fault has occurred.

If the process of step S50 is completed, or if a negative determination is done in step S40, in step S52, the counter T is initialized, and the forcible off-operation process is ended.

Hereinafter, advantages of the present embodiment will be described.

(1) If a potential difference between the reference terminal (emitter) and the opening and closing control terminal (gate) of the switching element SY# does not reach a value equal to or less than the threshold voltage Vth even though an off-operation command is inputted, the switching elements SY# is forcibly turned off. Hence, first, the fault, in which the gate voltage remains an intermediate voltage between the voltage VH and the threshold voltage Vth, can be appropriately handled. Furthermore, the fault, in which the gate voltage remains the voltage VH, can be also handled.

(2) The process for forcibly turning off the switching element SY# is performed by using the soft breaking switching element 54 and the off-keeping switching element 60. Thus, by using a path other than the normal time discharging path (paths of discharging switching element 32 and the discharging resistor 30) for shifting the switching element SY# to an off-state, accuracy in the process for forcibly turning off the switching element SY# can be increased. This is because, when a fault has occurred, the normal time discharging path cannot function normally.

In addition, by performing a process for forcibly turning off the switching element SY# by using a plurality of connection paths between the reference terminal (emitter) and the opening and closing control terminal (gate) of the switching element SY#, the process can reliably be performed.

(3) The process for forcibly turning off the switching element SY# is performed by using an off-keeping path (off-keeping switching element 60). In this case, since the impedance of the off-keeping path including the off-keeping switching element 60 is very low, the switching element SY# can reliably be turned off even in the case of a fault in which the DC voltage source 22 and the terminal T3 are short-circuited.

Second Embodiment

Hereinafter, the second embodiment will be described focusing on differences from the first embodiment.

In the present embodiment, when the operation signal gY# serves as an on-operation command, it is monitored whether or not the gate voltage of the switching element SY# increases up to the voltage VH. If the gate voltage of the switching element SY# does not increase up to the voltage VH, a forcible on-operation process is performed in which the switching element SY# is forcibly turned off.

Figure 5:
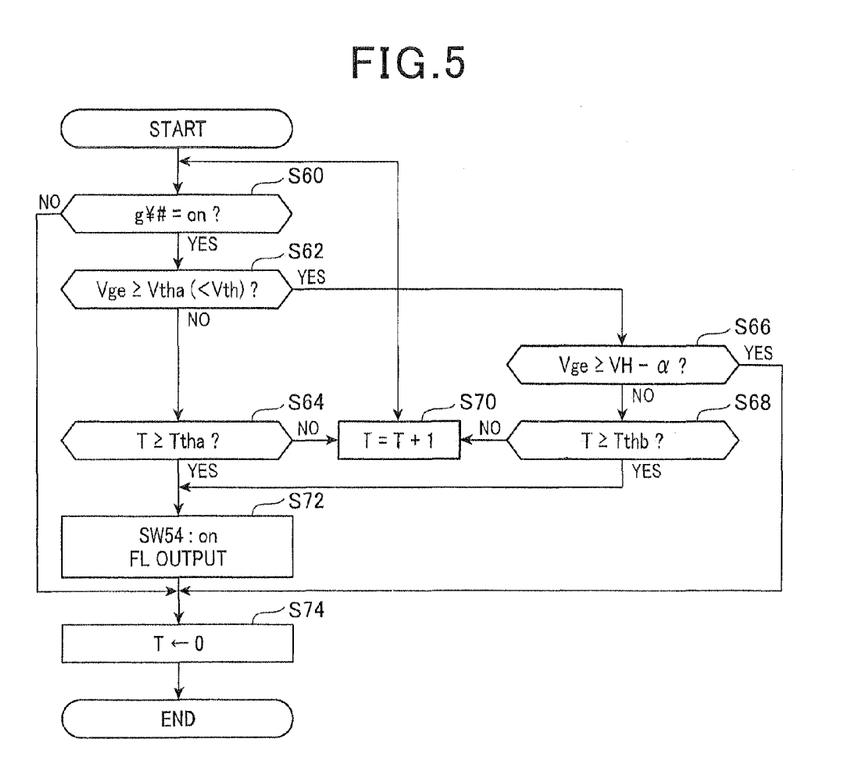
FIG. 5 is a flow diagram showing a procedure of a forcible discharge process when an on-operation is performed according to a second embodiment.

FIG. 5 shows a procedure of the forcible on-operation process according to the present embodiment. This process is performed by the drive controller 34.

In the forcible on-operation process, first in step S60, it is determined whether or not the operation signal gY# is an on-operation command. If it is determined that the operation signal gY# is an on-operation command, in step S62, it is determined whether or not the gate voltage Vge is equal to or more than a first threshold value Vtha. This process is for determining whether or not the switching element SY# has been changed to an on-state in practice. In the present embodiment, the first threshold value Vtha is set so as to be smaller than the threshold voltage Vth at which the switching element SY# changes to an on-state. This is because it is determined that the switching element SY# has been changed to an on-state in practice based on the fact that the gate voltage has increased when the operation signal gY# is changed to an on-operation command. If the first threshold value Vtha is set to the off-keeping threshold voltage, the number of means for generating threshold values can be decreased.

In step S62, if a negative determination is done, it is determined whether or not the counter T, which clocks time elapsed since the operation signal gY# is changed to an on-operation command, is equal to or more than a first threshold time Ttha. The first threshold time Ttha is set so as to be equal to or more than the time assumed to be required for the gate voltage to increase up to the first threshold value Vtha. In step S64, if a negative determination is done, in step S70, the counter T is incremented. Then, the process proceeds to step S60. In contrast, in step S64, if a positive determination is done, in step S72, the soft breaking switching element 54 is turned on. In addition, in step S72, a fail signal FL is outputted to the controller 18. Hence, the user can be informed via the controller 18 that a fault has occurred.

In step S62, if a positive determination is done, in step S66, it is determined whether or not the gate voltage Vge is equal to or more than a second threshold voltage. This process is for determining whether or not the gate voltage of the switching element SY# has increased up to the voltage VH of the DC voltage source 22. Note that the second threshold voltage is set to a value obtained by subtracting the amount of a margin a from the voltage VH.

In step S66, if a negative determination is done, in step S68, it is determined whether or not the counter T is equal to or more than a second threshold time Tthb. This process is for determining whether or not a fault has occurred in which the switching element SY# is not turned on normally. The second threshold time Tthb is set so as to be equal to or more than the time assumed to be required until the gate voltage Vge of the switching element SY# converges into a normal value (voltage VH). Note that, the process configures an on-operation determination means.

In step S68, if a negative determination is done, in step S70, the counter T is incremented. Then, the process returns to step S60. In contrast, in step S68, if a positive determination is done, the process proceeds to step S72. Note that, in step S68, if a positive determination is done, the process of step S72 configures a forcible on-operation processing means in the present embodiment.

In any cases where the process of step S72 is completed, where a negative determination is done in step S60, and where a positive determination is done in step S66, in step S74, the counter T is initialized. Then, the forcible on-operation process is ended.

Hereinafter, advantages of the present embodiment will be described.

(4) If the gate voltage Vge does not reach a convergence value of a normal time even though the operation signal gY# is an on-operation command, the switching element SY# is forcibly turned off. Thereby, in a state where impedance of a current path of the switching element SY# is abnormally high, a situation that current continues flowing can be promptly avoided. Hence, a situation where the switching element SY# fails due to overheat can be appropriately avoided.

(5) If the gate voltage Vge does not increase even though the operation signal gY# is an on-operation command, the switching element SY# is forcibly turned off. Hence, driving the switching element SY# can be stopped when a fault has occurred.

Third Embodiment

Hereinafter, the third embodiment will be described focusing on differences from the second embodiment.

Figure 6:
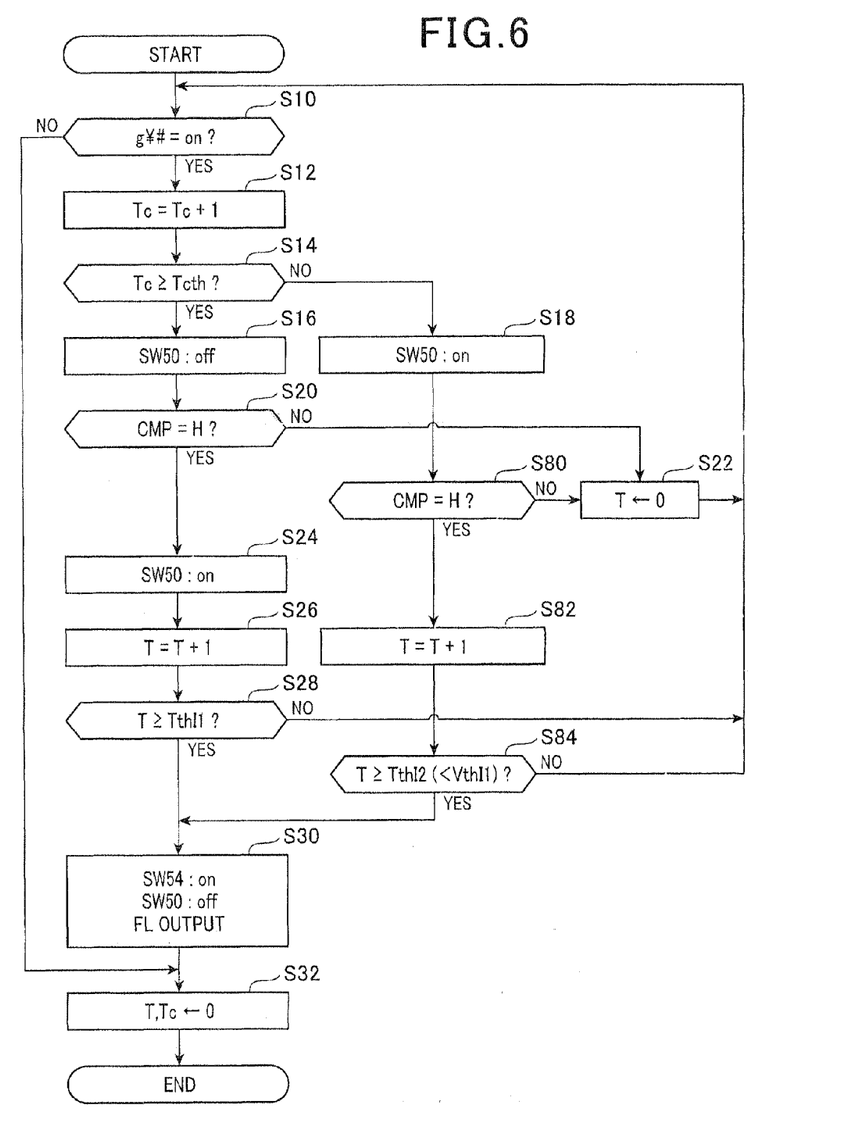
FIG. 6 is a flow diagram showing a procedure of an overcurrent breaking process according to the second embodiment.

FIG. 6 shows a procedure of an overcurrent breaking process according to the present embodiment. This process is performed by the drive controller 34. In FIG. 6, the step corresponding to that shown in FIG. 3 is denoted with the same step number for the sake of convenience.

As shown in FIG. 6, in the present embodiment, after the process of step S18, in step S80, it is determined whether or not an output signal CMP of the comparator 44 is logic "H". If it is determined that the output signal CMP is logic "H", in step S82, the counter T is incremented. In step S84, it is determined whether or not the counter T is equal to or more than a full-on threshold time TthI2 which is less than the overcurrent threshold time TthI1. This process is for determining whether or not the switching element SY# is forcibly turned off. Note that the full-on threshold time TthI2 is shortened compared with the overcurrent threshold time TthI1, which is used immediately after the switching element SY# is changed to an on-state, considering that, when impedance of a path of a current flowing through the switching element SY# decreases in a state where the gate voltage Vge is higher, the current value becomes significantly large. That is, by shortening the full-on threshold time TthI2, the process for forcibly turning off the switching element SY# is promptly performed.

Note that, in step S84, if a positive determination is done, the process proceeds to step S30. In contrast, in step S84, if a negative determination is done, the process returns to step S10. If a negative determination is done in step S80, the process shifts to step S22.

As described above, according to the present embodiment, the threshold time is shortened which serves as a condition for forcibly turning off the switching element SY# if a predetermined time has passed since the operation signal gY# is changed to an on-operation command. Hence, a situation can be avoided that a current causing a fault flows through the switching element SY#.

Other Embodiments

The above embodiments may be modified as described below.

Regarding the "off-operation determination means":

The off threshold voltage VthL1 is not limited to a voltage smaller than the threshold voltage Vth at which the switching element SY# is turned on. For example, even in the case of the threshold voltage Vth, if a negative determination is done in step S42 of FIG. 4, it can be determined that the gate voltage of the switching element SY# does not reach the voltage at which the switching element SY# is turned off.

Regarding the "forcible off-operation processing means":

In FIG. 4, when the duration, during which the gate voltage Vge becomes equal to or more than the off threshold voltage VthL1, has become equal to or more than the off threshold time TthL, the switching element SY# is forcibly turned off. However, for example, if the gate voltage Vge is equal to or more than the off threshold voltage VthL when a specified time has passed since the timing at which the operation signal gY# is changed to an off-operation command, the switching element SY# may be forcibly turned off.

The process for forcibly turning off the switching element SY# is not limited to turning on both the off-keeping switching element 60 and the soft breaking switching element 54. For example, only the soft breaking switching element 54 may be turned on. In addition, elements other than the off-keeping switching element 60 and the soft breaking switching element 54 may be used. For example, the clamping switching element 46 may be used for an aspect different from the clamping process by applying voltage larger than the output voltage of the operational amplifier 48 to the clamping switching element 46. Furthermore, a dedicated switching element may be provided so as to be turned on.

Regarding the "forcible on-operation processing means":

In FIG. 5, if the gate voltage Vge, at the time when the second threshold time Tthb has passed from the timing at the timing the operation signal gY# is changed to an on-operation command, is not equal to or more than the second threshold voltage (VH−α), gate charge is forcibly removed. However, for example, if the duration, during which the gate voltage Vge becomes less than the second threshold voltage (VH−α), has become equal to or more than the second threshold time Tthb, the switching element SY# may be forcibly turned off.

The process for forcibly turning off the switching element SY# is not limited to turning on only the soft breaking switching element 54. For example, the soft breaking switching element 54 and the off-keeping switching element 60 may be turned on. Alternatively, the discharging switching element 32 may be turned on.

Regarding the "overcurrent breaking processing means":

The determination whether or not an overcurrent flows to the switching element SY# is not necessarily done based on the sense voltage Vse. The determination may be done based on a detection value of potential difference between a pair of ends (collector and emitter) of a current path of the switching element SY#.

Regarding the "target switching element":

The target switching element is not necessarily an IGBT, but may be an N-channel MOSFET (metal-oxide semiconductor field-effect transistor). Alternately, the target switching element may be a P-channel MOSFET. Note that, in this case, since the target switching element is turned on when potential difference between a reference terminal (source), which is one end of a current path which opens and closes, and an opening and closing control terminal (gate) is minus, positive charge is provided to the gate when the target switching element is turned off.

Regarding the "series connection":

The series connection of the high-potential side switching element SY# and the low-potential side switching element SY# may not configure an inverter INV or a step-up and step-down chopper circuit (converter CNV). In a case where a DC voltage source is connected to the series connection of the high-potential side switching element SY# and the low-potential side switching element SY# with low impedance, an overcurrent flows when both the switching elements SY# are turned on. Hence, the series connection of the above embodiment is effectively applied.

However, the series connection is not essential. Even when the series connection is not configured, the process for forcibly turning off the switching element can be effectively performed in such a case where an on-state is continued regardless of the off-operation command.

Regarding the "drive circuit": In the above embodiment, when changing the switching element SY# to an on-state, the constant current control is performed to keep constant the charging current of the gate. However, the constant voltage control may be performed in a state where the voltage applied to the gate of the charging switching element 26 shown in FIG. 2 is a fixed value.

Hereinafter, aspects of the above-described embodiments will be summarized.

As an aspect of the embodiment, a drive unit for a switching element is provided. The drive unit includes: a drive circuit (22, 24, 26, 30, 32, 34) which changes a target switching element (SY#) between an on-state and an off-state, by a controlling a potential difference between a reference terminal, which is one of a pair of ends of a current path of the target switching element, and an opening and closing control terminal of the target switching element; a determination section (S42, S66) which determines, if an on-operation command or an off-operation command is inputted as an operation signal for the target switching element, whether or not the potential difference has reached a specific value toward which the potential difference shifts, in response to one of the operation commands, with respect to a threshold value by which the target switching element is turned on; and a forcible processing section (S50, S72) which removes charge for turning on the target switching element from the opening and closing control terminal, if the determination section determines that the potential difference has not reached the specific value.

In the embodiment, if the potential difference has not reached a value at which the target switching element turns on regardless of the on-operation command, of if the potential difference has not reached a value at which the target switching element turns off regardless of the off-operation command, the target switching element is turned off. Hence, a situation can be appropriately avoided where the target switching element continues driving when a fault has occurred.

As another aspect of the embodiment, the overcurrent breaking section forcibly turns off the target switching element if the duration, during which it is determined that the current flowing through the target switching element is equal to or more than the threshold value, is equal to or more than a specified time, and may include a change section which changes the specified time so as to be decreased.

It will be appreciated that the present invention is not limited to the configurations described above, but any and all modifications, variations or equivalents, which may occur to those who are skilled in the art, should be considered to fall within the scope of the present invention.

What is claimed is:

1. A drive unit for a switching element, comprising:
a drive circuit which changes a target switching element between an on-state and an off-state, by controlling a potential difference between a reference terminal, which is one of a pair of ends of a current path of the target switching element, and an opening and closing control terminal of the target switching element;
a determination section which determines, if an on-operation command or an off-operation command is inputted as an operation signal for the target switching element, whether or not the potential difference has reached a specific value toward which the potential difference shifts, in response to one of the operation commands, with respect to a threshold value by which the target switching element is turned on; and
a forcible processing section which removes charge for turning on the target switching element from the opening and closing control terminal, if the determination section determines that the potential difference has not reached the specific value, wherein
the determination section includes an off-operation determination section which performs the determination if the off-operation command has been inputted as the one of the operation commands, and
the forcible processing section includes a forcible off-operation process section which performs a process for removing charge to turn on the target switching element, if the off-operation determination section determines that the potential difference has not reached the specific value, by using a path for decreasing the potential difference to change the target switching element to an off state, the path being other than a normal time discharging path used for changing the target switching element between an on-state and an off-state in normal time,
the drive unit further comprises an off-keeping path which keeps an off-state of the target switching element by establishing a short circuit between the reference terminal and the opening and closing control terminal,
the off-keeping path includes an off-keeping switching element which opens and closes the path; and
the forcible off-operation process section turns on the off-keeping switching element to remove charge for turning on the target switching element from the opening and closing control terminal.

2. The drive unit according to claim 1, wherein
the target switching element configures a series connection of a high-potential side switching element and a low-potential side switching element, the series connection being connected to a DC voltage source in parallel, and
the drive unit further comprises:
an overcurrent determination section which determines whether or not a current flowing through the target switching element is equal to or more than a threshold value if the operation signal is the on-operation command; and
an overcurrent breaking section which forcibly turns off the target switching element if the overcurrent determination section determines that the current flowing through the target switching element is equal to or more than the threshold value.

3. The drive unit according to claim 1, further comprising a soft breaking discharging path having impedance higher than that of the normal time discharging path, wherein
- the soft breaking discharging path includes a soft breaking switching element which opens and closes the path, and
- the forcible off-operation process section turns on the soft breaking switching element to remove charge for turning on the target switching element from the opening and closing control terminal.

4. The drive unit according to claim 1, wherein
- the determination section includes an on-operation determination section which performs the determination if the on-operation command has inputted as the one of the operation commands,
- the forcible processing section includes a forcible on-operation process section which performs a process for removing charge to turn on the target switching element, if the on-operation determination section determines that the potential difference has not reached the specific value, by using a path for decreasing the potential difference to change the target switching element to an off-state, and
- the on-operation determination section sets the specific value to the potential difference by which a current flows which is larger than the maximum value in a normal time of a current flowing through the target switching element.

* * * * *